United States Patent [19]
Landesman et al.

[11] Patent Number: 5,944,896
[45] Date of Patent: Aug. 31, 1999

[54] ADJUSTABLE SUPPORT FOR PRINT SCREENS

[75] Inventors: David A. Landesman; Benjamin J. Landesman, both of St. Louis, Mo.; Henry H. Hammond, III, Bunker Hill, Ill.

[73] Assignee: Lawson Screen Products, Inc., St. Louis, Mo.

[21] Appl. No.: 08/935,459

[22] Filed: Sep. 24, 1997

[51] Int. Cl.⁶ .................................................. B05C 13/00
[52] U.S. Cl. ...................... 118/500; 118/503; 248/125.7; 248/130; 248/131; 269/71
[58] Field of Search .................................... 118/500, 503; 248/125.7, 130, 131, 458; 269/71

[56] References Cited

U.S. PATENT DOCUMENTS

| | | | |
|---|---|---|---|
| 194,657 | 8/1877 | Date | 118/503 |
| 639,917 | 12/1899 | Arnold | 248/125.3 |
| 684,097 | 10/1901 | Quigley et al. | 118/500 |
| 1,725,072 | 8/1929 | Gorrell | 118/503 |
| 1,936,529 | 11/1933 | Taylor | 248/125.3 |
| 1,945,572 | 2/1934 | Sandbrook | 118/503 |
| 2,557,231 | 6/1951 | Miller | 118/503 |
| 2,569,620 | 10/1951 | Steckling | 118/503 |
| 2,593,738 | 4/1952 | Dollahite | 118/503 |
| 3,955,722 | 5/1976 | Bard | 248/125.1 |
| 5,090,648 | 2/1992 | Wood, IV | 248/125.3 |
| 5,164,011 | 11/1992 | Ray | 118/503 |
| 5,725,192 | 3/1998 | Cloninger | 248/458 |

FOREIGN PATENT DOCUMENTS

2421788  12/1979  France ........................................ 269/71

*Primary Examiner*—Laura Edwards
*Attorney, Agent, or Firm*—Blackwell Sanders Peper Martin

[57] ABSTRACT

A device for adjustably supporting a print screen during application of emulsion includes an upright stand assembly which is adapted to permit vertical adjustment of the position of a print screen mounted on a screen frame support rack on the device. A screen frame support rack is rotatably connected to the stand assembly in such manner as to permit selective vertical rotation of the entire screen frame support rack by up to at least 180° around a first axis, which first axis is substantially horizontal and extends radially, outwardly from longitudinal axis of the upright stand. The screen frame support rack is adapted to support the print screen in such a manner as to permit selective rotation of the print screen around a second axis of rotation to any angle up to at least 180°, the second axis of rotation being a central axis of the print screen; so thath the position of a print screen supported on the device can be selectively adjusted both vertically and rotationally, the rotational adjustments being available around two different axes.

20 Claims, 5 Drawing Sheets

ADJUSTABLE SUPPORT FOR PRINT SCREENS

BACKGROUND AND SUMMARY OF THE INVENTION

The present invention relates generally to the field of support devices for supporting print screens during application of emulsion or other coating materials, and, more specifically, to a support device designed especially for supporting print screens in a manner which permits 360 degree rotation for the screen around two different axes, as well as permitting the operator to adjust the height at which the screen is supported, for optimal comfort and convenience in use of the device.

It is well known in the screen printing industry that prior to use of a screen for printing it is usually necessary to condition the screen by applying a coating of liquid emulsion. The coating material may be applied with a brush, but ordinarily is sprayed over the screen to apply an even layer over the entire screen surface, on one or both flat side surfaces of the screen. The screen to be prepared is ordinarily stretched taught over a rigid rectangular frame, which frame with the screen attached is later transferred to the printing press for use in printing piece goods such as "t-shirts" or other textiles. The frames used in such printing presses may vary somewhat in size and shape, within the parameters allowed by a particular printing press, or as required for a certain job.

Because a different print screen is prepared for each design and/or color to be printed, it is clear that a great number of screens may be required by even a relatively small print shop, and particularly by shops of the type which cater to large and varied crowds, and/or by manufacturers which provide pre-made screens to specialty shops, such as t-shirt stores. The process of coating the framed print screens for further use necessarily becomes tedious when more than a few screens must be prepared.

As the emulsion coating process is generally done manually, such tedium increases the chance that the coating may be applied incompletely or unevenly. This risk increases with operator fatigue, which naturally occurs with preparation of multiple screens which must be turned and viewed from various angles to ensure complete coating. Improper height of the screens being so laboriously coated can require the worker to operate in unnatural or inconvenient body positions, resulting in pain to the worker's back, shoulders, neck, etc. Such worker discomfort can result in screens which are less than ideally coated with emulsion, and can thus eventually lead to printed goods of less than the best quality.

Previously, although a variety of supports for flat work pieces of various types were conceived, none of those supports were suitable for the goals of the present invention. No support devices were known which were designed specifically for use as multi-directional rotatably adjustable supports for print screens for coating or other treatment thereof. Rather, the screen emulsion coating process was done in a variety of haphazard ways, with the screen propped up against a wall or laid flat, horizontally on a table or between the edges of two tables or other supports, such as saw horses. These methods necessarily had drawbacks, as they could become uncomfortable for a worker who was forced to bend over repeatedly, or required to stand for extended periods of time to coat numerous screens.

Also, in addition to worker fatigue, because of inconsistent, imperfect lighting and screen position, the coating applied in known manner was sometimes not well applied, eventually resulting in printing of inferior quality. Furthermore, the known coating methods were messy, as it was necessary for the worker to occasionally touch the wet screen frame to reposition it for application of emulsion to a different surface.

Although the new support device is conceived with the particular purpose of print screen coating in mind, as will become clear with the description hereafter, other very useful purposes can be imagined for which device 10 is suitably adapted, and which uses would be considered to be well within the scope of this invention, particularly when there is involved support of a flat rectangular piece which is to be attended to on both flat sides thereof, and when it is preferred to be able to adjust the height of work piece at any time during the treatment process.

Accordingly, it is among the objects of the present invention to provide a support device for flat work pieces of various sizes having rigid edges or which are connected to a rigid frame, which support device is adapted for facile, pivotal touch-free adjustment of the position of the work piece by 360° around a central axis of the work piece supported upon the device, spacedly from the vertical support member thereof. The new support device is also structured to permit the work piece to be rotatable at least 180° and even 360° or more around an axis extending substantially horizontally and radially from the device, and to also be reliably retained in a variety of preselected angled positions on the support device.

It is further among the objects of the present invention that the new support device be capable of vertical adjustment in a quick and facile manner so as to permit the work piece to be supported at a height which is ergonomically preferred by any particular user. The device of the present invention is further expected to be optionally mounted on casters, slides, rails, or other suitable structure for making the device easily movable on a floor or other support surface so that the work piece can be attended to in an environment with optimal lighting, air movement, space, and other ambient conditions.

It is still further among the objects of the present invention that the support device having the features indicated be suitable for attachment of a light to enhance the user's viewing of the work piece and of the coating being applied or other treatment to which the work piece, such as a print screen, is being submitted.

It is also among the objects of the present invention having the features mentioned that the new support device be of uncomplicated, straight-forward construction of known materials and thus economical to manufacture and to maintain, and that it be facile to assemble and use by individuals with little or no training, even when provided with optional automatic adjustment and lighting features.

Accordingly, in furtherance of the above objects and advantages, the present invention is, briefly, a device for adjustably supporting a print screen during application of emulsion. The device includes an upright stand assembly which is adapted to permit vertical adjustment of the position of a print screen mounted on a screen frame support rack on the device. A screen frame support rack is rotatably connected to the stand assembly in such manner as to permit selective vertical rotation of the entire screen frame support rack by up to at least 180° around a first axis, which first axis is substantially horizontal and extends radially, outwardly from longitudinal axis of the upright stand. The screen frame support rack is adapted to support the print screen in such a manner as to permit selective rotation of the print screen around a second axis of rotation to any angle up to at least 180°, the second axis of rotation being a central axis of the print screen; so thath the position of a print screen supported on the device can be selectively adjusted both vertically and rotationally, the rotational adjustments being available around two different axes.

These and other advantages and objects of the invention will be in part apparent and in part pointed out hereinbelow.

BRIEF DESCRIPTION OF THE DRAWINGS

Throughout the drawings like parts are indicated by like element numbers.

DESCRIPTION OF PRACTICAL EMBODIMENTS

Figure 1:
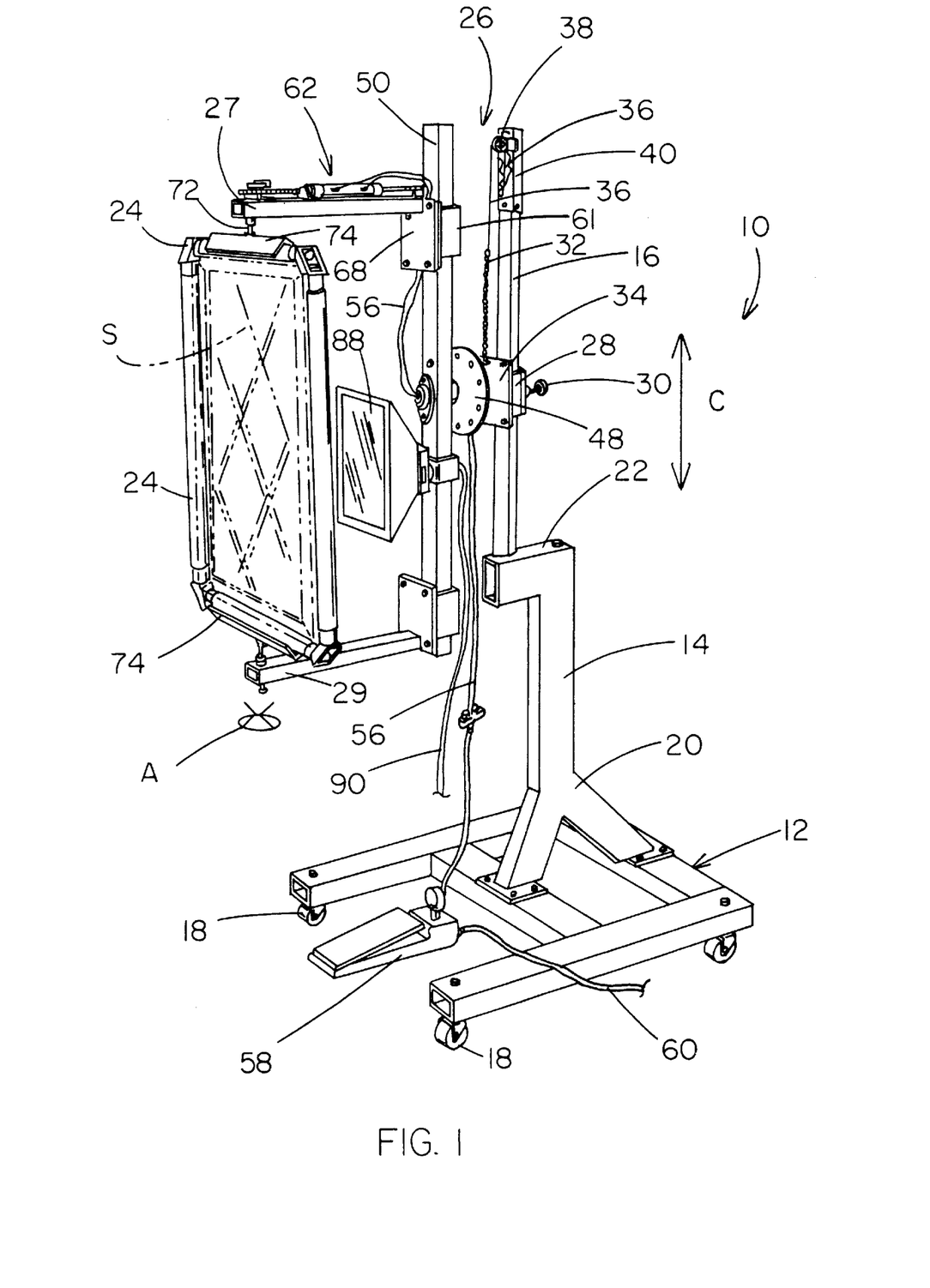
FIG. 1 is a front perspective view of an adjustable support device for a print screen or other generally planar work piece, showing a print screen in phantom in a frame disposed vertically on the device.
Figure 2:
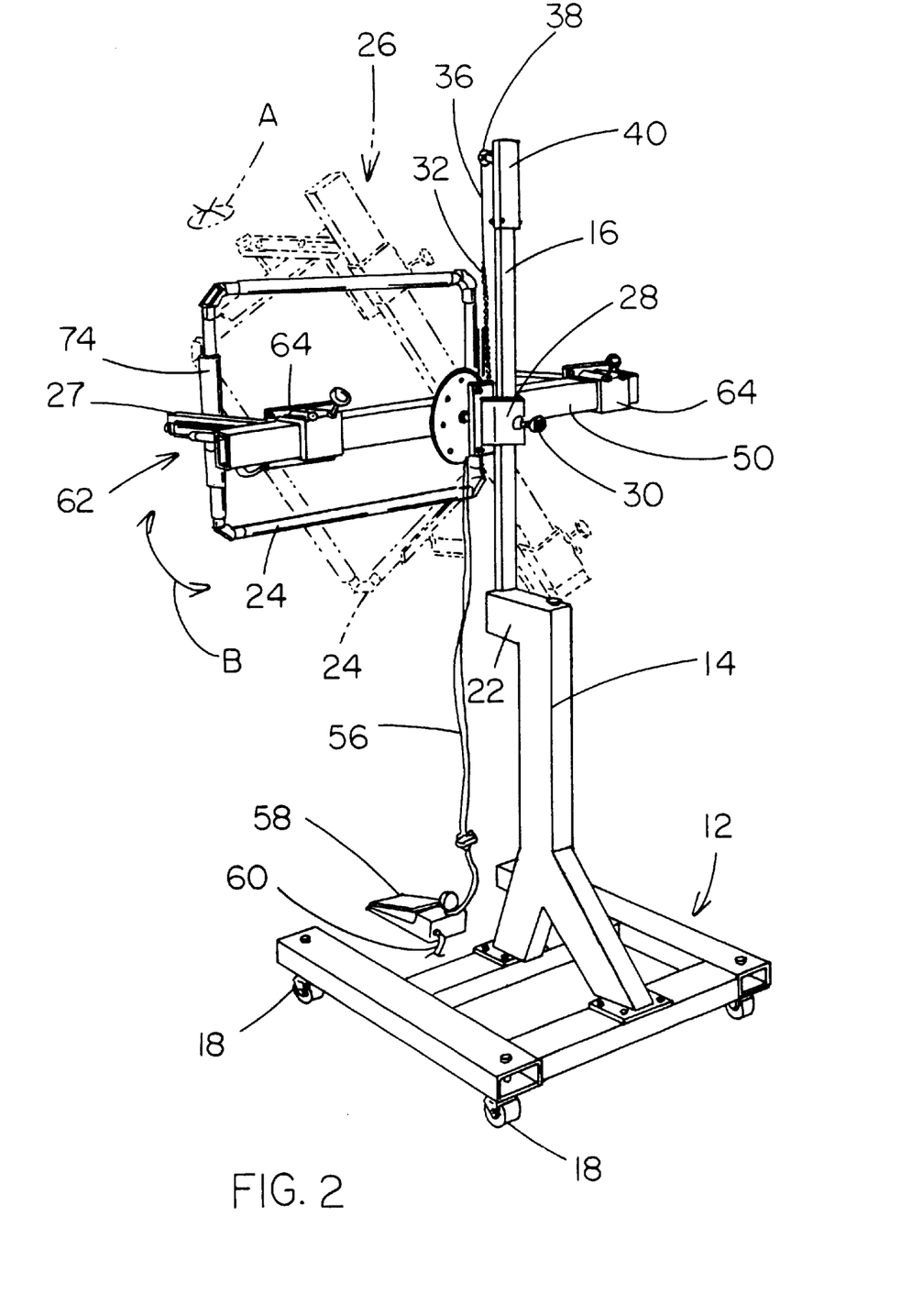
FIG. 2 is a rear perspective view of the support device of FIG. 1, with the rack holding the screen frame disposed horizontally, i.e., turned 90° from the position shown in FIG. 1, and with a position intermediate to that of FIG. 1 and the solid lines of FIG. 2 shown in phantom.
Figure 3:
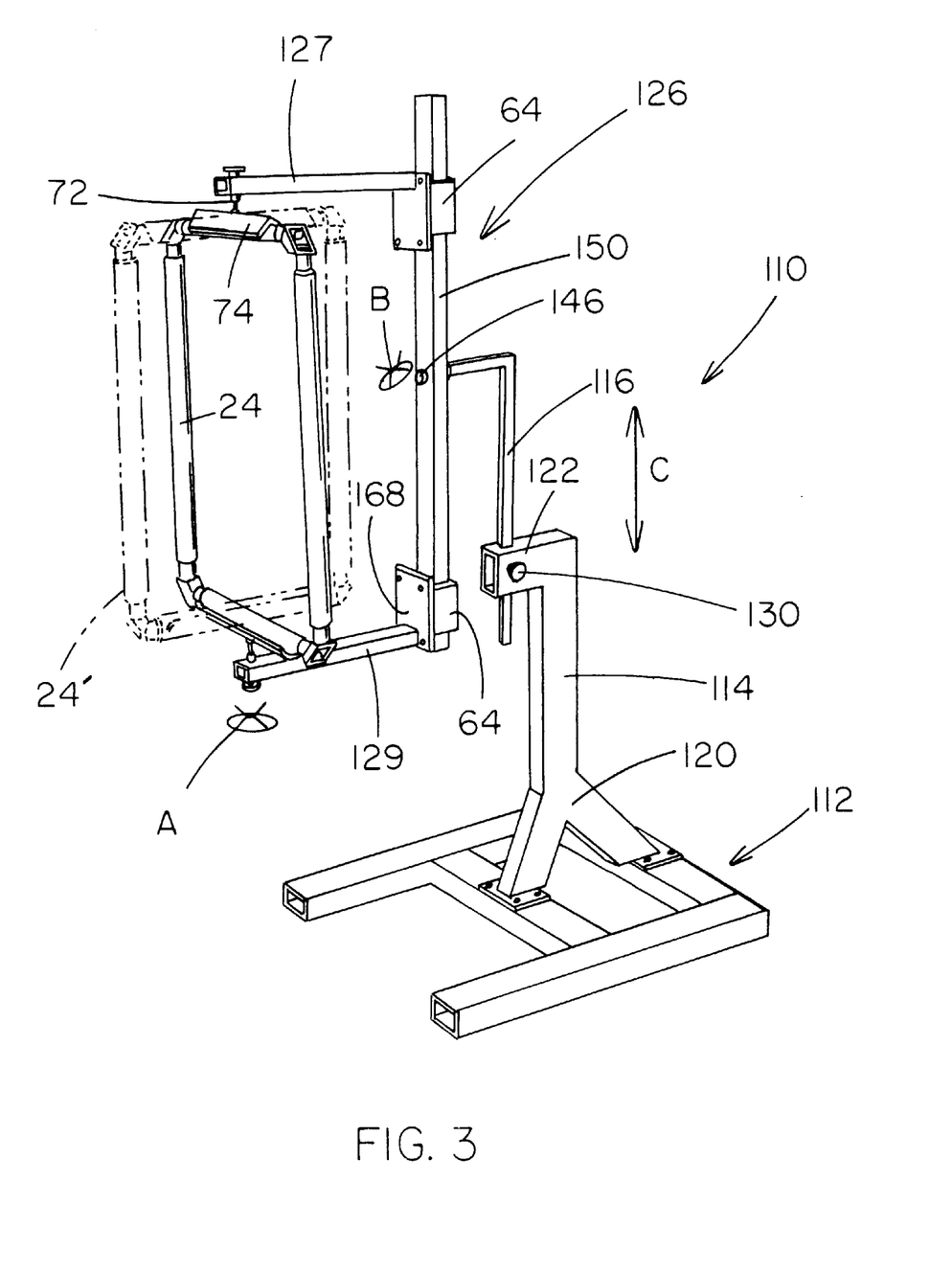
FIG. 3 is a front perspective view of another, simplified embodiment of the device of FIG. 1, with the print screen rack and frame therein disposed vertically, and showing in phantom the frame pivoted horizontally about the central longitudinal (vertical) axis substantially 90°.

With reference to the drawings, and particularly FIGS. 1 and 2, 10 generally designates an adjustable support device for retaining print screens during the emulsion coating process. In FIG. 3 there is shown an alternative embodiment, generally designated 110, of the new support device. Throughout the following description elements which are identical in the different embodiments are usually indicated with identical element numbers. Elements which vary, but generally correspond to those of the first embodiment are designated in the embodiment of FIG. 3 with related element numbers, which are the same as those used in the first embodiment, but preceded by the numeral "1", as will be clear from the description hereafter, with reference to the drawings.

The unique structure of support device 10 permits the position of the print screen or other planar work piece (such as that shown in phantom and indicated at S in FIG. 1) to be selectively adjusted at least by a full 180° side-to-side (i.e., front to back and vice versa), as well as by at least 180° end-to-end; although in both cases it is preferred that this rotation be at least 360° and will sometimes be referred to as such hereafter.

Rotation along one axis of the screen (the central longitudinal axis, which is vertical when the screen is supported as shown in FIG. 1), enables the user to pivotally rotate the screen side-to-side (as indicated by the frame positions shown in FIG. 3 and described further hereafter), to permit the user to have full and ready access to both the front and back flat surfaces of the screen for applying emulsion thereto. This rotation is indicated generally by the arrows A in FIGS. 1, 2 and 3.

For purposes of this description it is to be understood that when the various parts of support device 10, 110 are arranged as shown in the drawing, the user (not shown) ordinarily will be positioned generally in front of the support device 10, 110; i.e., at the left side of FIG. 1, 3 respectively, with one flat surface of the screen facing the user.

As illustrated in FIG. 2 (and discussed further hereafter with reference to shaft 46) support 10 also includes structure which provides the user with selective rotation of up to at least 180°, and preferably up to at least 360°, of screen S, end-to-end, around an axis which extends substantially horizontally and radially from the main support member, toward a user positioned as described above, directly in front of the device. It is to be understood that throughout the following description of support 10, 110, although the device permits rotation of screen frame 24 and screen S mounted therein by at least 360° about two different axes, the optional rotation around either or both of the axes described may be selectively terminated at any point less than 360°, or, on the other hand, may be continued beyond 360° as the operator of device 10, 110 may choose. Moreover, such rotation around either axis can be in either of the clockwise or counter-clockwise directions, as will be clear from the figures and the following description.

It is to be further understood that screen frame 24 is shown and described as being rectangular, for ease of discussion and because this is the shape most commonly used. Screen S or other work piece will, in most instances, be generally planar and endowed with a stiff, or at least semi-rigid frame perimeter or outer edge for best results in adjustable mounting on the new support device.

By showing screens and frame 24 as rectangular the perpendicular long and short axes of the screen or screen frame can be more readily used as reference points to clarify the overall structure and movement of device 10. Thus, for purposes of this discussion, the longitudinal axis of screen S is disposed vertically in FIG. 1, parallel to the longitudinal (vertical) axis of device 10, and the short axis of frame 24 is disposed horizontally, transverse to the length of support device 10.

Nonetheless, screen S and the frame 24 which supports the screen on device 10,110 may be perfectly square, having both axes of equal length, or even of some other shape, without inhibiting the manner in which device 10 is formed and functions. The shapes described are examples only, for purposes of discussion and alterations necessary for accommodating a screen of a different shape than that shown will be understood by one skilled in the art.

More specifically, support device 10 generally includes a strong, generally horizontal base 12 upon which is fixed an elongated, rigid upright vertical member or stand 14 with a pole 16 supported upwardly and vertically therefrom to provide support device 10 with a main support structure which, as will be made clear, provides support 10 with vertical adjustability for user convenience and comfort. Corresponding elements in the alternative embodiment of FIG. 3 are correspondingly numbered.

Base 12 is preferably composed of a horizontal framework of channel iron pieces welded or otherwise securely interconnected so as to provide a strong heavy platform upon which to mount rigid, upright stand 14. Other mechanisms or structures for the base are readily conceived which will function adequately, as long as they are sufficiently strong and heavy to support the upper portion of the device and a screen mounted thereon, to off-set the weight of the other portions of the device, and to thereby prevent device 10 from toppling over.

For ease of moving device 10 from one location to another, base 12 can be mounted by any suitable known movable support mechanism, such as slides, or rollers, or preferably casters, such as those indicated at 18 in FIGS. 1 and 2, for purposes of example only. Alternatively, the base can be formed or used without movable supports and then will sit flat upon the floor or other support surface, for example as shown with reference to the alternative 110 embodiment in FIG. 3, and the base 112 may even be bolted or otherwise connected to the floor, if desired, for stability or theft prevention.

Upright stand 14 has an upper end and a lower end. The lower end is desirably formed generally into an upside down Y-shape, with each arm of the lower Y portion 20 being secured to base 12, for example by flanges which are bolted to the base, or by welding or other suitable known methods. Other constructions for upright support 14 are known or can be conceived which will function at least as well. For example, a sturdy tripod structure is conceivable and is considered to be an useful equivalent of the structure shown.

The upper end of upright stand 14 extends substantially horizontally and forwardly in an L-portion or neck 22 which has mounted thereto an upright, rigid rod or pole 16. Pole 16 is secured vertically to neck 22 and may be fixed thereto by welding or bolting or other suitable known means, as illustrated in FIGS. 1 and 2. In the alternative embodiment, the upright pole portion 116 is mounted in an aperture or through-hole (not seen) formed vertically through neck portion 122. As shown in FIG. 3., neck 122 is provided with a vertical through-hole formed to such size and shape as are appropriate for vertical sliding, or telescoping, movement of a pole 116 therethrough.

In this fashion pole 116 can be adjusted along its length from about the mid-point to the lowermost end, and can be secured at any preselected height in known manner, for example by loosening and tightening a thumbscrew 130 Because upright pole 116 has the remaining portions of corresponding device 110 mounted thereto, this simple adjustment of pole 116 provides facile adjustment of the height of the entire print screen frame 124.

By contrast, in the first embodiment, pole 16 is fixed at the lower end thereof to the forwardly directed end (or to the upper surface) of neck 22, as shown in FIGS. 1 and 2. Vertical adjustment in the first embodiment, indicated generally by arrows C, is accomplished by movable connection of frame 24 to pole 16 via a screen frame support rack, generally designated 26 which is slidably mounted by a sleeve 28 to pole 16. Sleeve 28 is made tightenable and releasable in relation to pole 16, for example, by virtue of at least one conventional thumb screw 30, which threadably penetrates sleeve 28, preferably substantially perpendicularly in relation to the longitudinal axis of pole 16.

Due to the weight of screen frame rack 26 and various elements mounted thereon, to be described hereafter, a great deal of stress is placed on all structural elements at the site of connection between sleeve 28 and pole 16. This stress is preferably offset by the optional additional feature of a counter-balance mechanism, one example of which is described immediately hereafter with reference to FIGS. 1, 4 and 5.

In the first embodiment, one end of a length of chain 32 is connected to a rigid plate 34 which is either fixed to or which forms an integral front wall of sleeve 28. Chain 32 is preferably connected at an upwardly directed end to a downwardly directed end of a length of cable 36. Cable 36 is mounted on at least one pulley 38 which is vertically and rotatably mounted at the upper end of pole 16, preferably by mounting the pulley to a metal cap 40 which is firmly attached (as, for example, by bolts or other connectors) to the upwardly directed end of pole 16. Alternatively, and as an example only, cap 40 can be omitted and pulley 38 can be rotatably attached directly to pole 16.

For strength of construction it is preferred that cap 40 actually be fitted over the end of pole 16 and bolted at the lower end of the cap in such manner that the cap is removable. However, it will be apparent to the skilled artisan that other strong constructions, some of which are removable, will suffice.

Cap 40 has an opening suitably sized and located adjacent to the site of connection of pulley 38 so as to permit passage therethrough of cable 36 which extends downwardly into the hollow interior length of pole 16. This structure is indicated, for clarity, with the opening enlarged and broken away in FIG. 1, at the top of pole 16.

Figure 5:
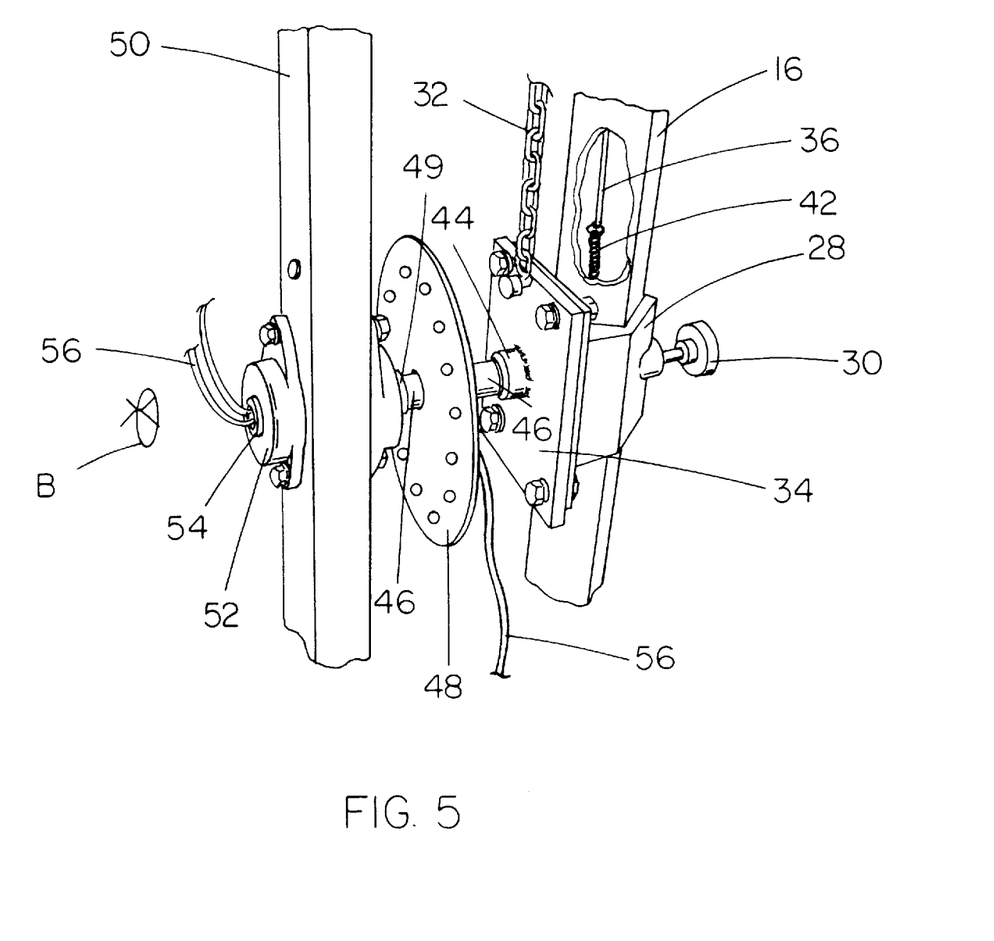
FIG. 5 is an enlarged perspective view, partially broken away, of optional counter balance and detent mechanisms of the device of FIG. 1, which detent mechanism is provided to permit the user to retain the frame support rack in a preselected position in relation to a radial axis extending from the main upright member of the support device.

With reference to FIG. 5, it is seen that inside hollow, rigid pole 16 the other, downwardly directed, end of cable 36 connects to one end of a helical tension spring 42 or other suitable biasing structure, which is connected to the lower inside of the pole to enhance vertical adjustment and retention of rack 36 in a preselected vertical position relative to pole 16. The above-described spring and cable arrangement provides a counter-balance to off-set the weight of the forwardly extending portions of support 10 and thereby enhances the ease of vertical adjustability of frame rack 26 and increases stableness of support device 10 overall.

FIG. 5 best illustrates that sleeve plate 34 has a bushing 44 fixed to, as by welding, for example, extending forwardly and perpendicularly from the approximate center of the front surface of the plate. Bushing 44 rotatably receives (for example, by internal mounting of a conventional roller bearing, not seen) the rearwardly directed end of a hollow pipe or shaft 46, which shaft extends forwardly through the center of a detent plate or disk 48 and serves as a horizontal, radially extending pivotal axis for "vertical" rotation of screen frame rack 26, as indicated generally by arrows B in FIG. 2.

The forwardly directed end of shaft 46 is fixedly received in a bushing 49 which is mounted to the rearward facing surface of a rigid bar 50 which forms the backbone of frame rack 26. On the forwardly directed surface of bar 50 is attached a bearing mount 52 and a roller bearing 54 disposed therein and positioned so as to be coaxially aligned with shaft 46. Alternatively, the rear end of shaft 46 can be fixed and the frame rack rotation can be provided at the forward end of shaft 46.

Conventional fluid lines 56 are passed through bearing 54 and rearwardly through shaft 46 before being directed at one end, downwardly to a foot operated control switch 58. Foot switch 58 is connected in known manner by further fluid lines 60 to a main source of power which is preferred to be air or hydraulic fluid. For present purposes it is especially preferred to use pneumatic power because of the ease of use and lack of messy and potentially dangerous spills occasioned by inadvertent or untimely disconnection of the fluid lines if hydraulic fluid is used. Of course other useful known power supplies and connections therefore will be apparent to one skilled in the art.

Figure 4:
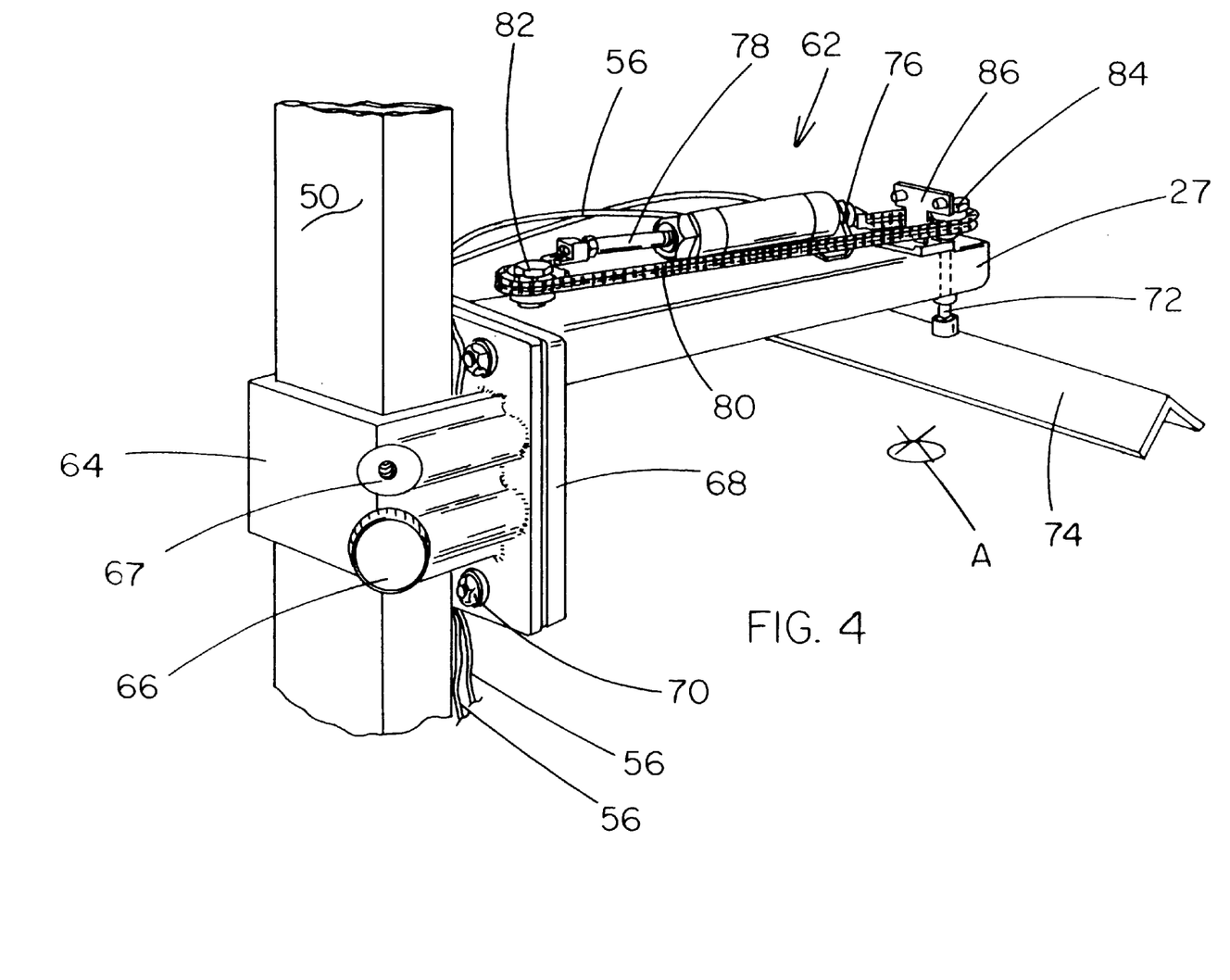
FIG. 4 is an enlarged rear perspective view, partially broken away, of the fluid cylinder and chain mechanism portions of the device of FIG. 1, which mechanism is provided to permit the user to cause a portion of the frame support rack to automatically rotate as illustrated in the direction(s) of arrows A.

FIGS. 1 and 4 illustrate that upwardly directed ends of fluid lines 56 are in fluid communication with a conventional fluid cylinder and piston assembly, generally indicated at 62, which assembly is mounted in parallel to an arm 27 of rotatable screen support frame 26 and which is discussed in more detail hereafter.

Arm 27 upon which fluid cylinder assembly 62 is mounted is one of two such rigid arms 27, 29 (otherwise substantially identical) which extend in the same direction, parallel to one another, forwardly from opposite ends of bar 50 of screen frame support rack 26, and substantially perpendicularly to bar 50. FIG. 4 most clearly illustrates, in enlarged rear perspective view, the preferred mechanism for adjustable attachment of arms 27, 29 to frame support rack backbone, rigid bar 50.

Although other connections are feasible, in the embodiments shown heavy collars 64 are slidably connected to each end of bar 50 and retained in preselected positions along the length of bar 50 by one or more releasable connectors such as conventional thumb screws indicated at 66, engage threaded shafts 67 sufficiently far to encounter an outside surface or wall of bar 50 and thus hold collar 64 in such position on bar 50 by the conventional pressure method.

A comparable assembly of collars 64 on bar 150 is conceived for the second embodiment shown in FIG. 3, (the thumbscrews not being visible in the figure). In each case, the cross-sectional size and shape of the collars is appropriate for close but slideably adjustable connection over the corresponding bar, to ensure a secure and strong, yet readily adjustable attachment of the screen support rack arms 27, 29 to backbone 50, in order to safely and readily accommodate print screens of varying sizes. It should also be noted that, as shown in FIGS. 1 and 4, the collar 64 at the top of bar 50, although slideably adjustable as just described, is sized sufficiently large, front to back, that there is a slight gap between the front of bar 50 and the rear facing surface of plate 68. The gap so defined is of sufficient depth to permit free passage therethrough of pneumatic lines 56, so as to prevent catching or binding and breaking of the lines during rotational or vertical movement of frame support rack 26.

In the illustrated embodiments at least one rigid plate 68 is fixed to or forms the front face of collar 64 and serves as a mounting site for a rearwardly directed end of an arm of the respective screen frame support 26, 126. If preferred for strength or convenience of manufacture, a second such rigid plate 68 can be overlaid onto the first and connected thereto, for example as by bolt assemblies 70, as illustrated, or by welding or other appropriate means.

Arms 27, 29 each have forwardly and rearwardly directed ends, the rearwardly directed ends each being fixed to a separate plate 68 so as to extend forwardly as shown. On the downward facing surface of each outer end of bars 27, 127 and on the upward facing surface of each outer end of bars 29, 129 there is rotatably and transversely connected, in known fashion, a pin 72 which is preferably centrally mounted to and serves as a pivot point for a piece 74 of angle iron in relation to a corresponding arm. FIG. 4 most clearly illustrates this connection for arm 27 of the first embodiment. This structural connection permits screen frame 24 to be securely but selectively releasably gripped by the angle iron pieces at each of two opposed ends of the frame, while still allowing the screen frame to be freely rotatable around an axis transverse to arms 27, 29.

The angle iron pieces attached to arms 27, 127 face or "open" downwardly as shown in FIGS. 3 and 4, and conversely, the angle iron pieces connected to arms 29, 129 open upwardly (when frame 26, 126 is positioned vertically, as shown in FIGS. 1 and 3), so as to receive the opposed ends of a screen frame, such as that shown at 24, for example, or the stiff edges of some other planar work piece.

Once positioned between two facing pieces of angle iron, a screen frame is secured therein by the simple act of loosening a thumbscrew 66 on either of the collars 64, at the upper and lower ends of bar 50 and moving the loosened collar, as far as possible, closer to the other collar on bar 50, so that the attached arms 27, 29 or 127, 129 are also moved closer together until the screen frame is squeezed tightly and held securely between the two pieces of angle iron 72.

Once secured as just described, the screen frame can be either automatically or manually rotated (depending upon the embodiment in use) to the desired position, front to back and end to end, to the user's preference. In the manual version shown in FIG. 3, front to back rotation is accomplished by simply touching either of the long edges of the frame 24 with the hand or a tool and gently rotating the frame around the pivot points (pins 72); i.e. in the example, around the central longitudinal axis of the frame.

In the first embodiment, automated rotation of the screen frame back to front or vice-versa is accomplished by use of the aforementioned fluid cylinder 62, as described hereafter. One end of cylinder 62 is secured by a known connector to the outwardly directed end of arm 27 on embodiment 10 (shown in this version, on the upper or outer surface, but conceivably on the lower surface), for example, by a bracket 76. At the opposite end of cylinder 62 there extends a piston shaft 78, in the usual fashion, the outermost end of which is connected to one end of a chain 80. Chain 80 is movably interconnected with a sprocket 82 which is mounted on the outer surface of the rearwardly directed end of the same arm 27.

Chain 80 continues around sprocket 82 and extends uninterrupted to and around a second sprocket 84 with which the chain is similarly movably intermeshed, in known fashion, until terminating at its other end which is preferably, although not necessarily, connected to the outwardly directed end of fluid cylinder 62. A T-shaped bracket 86 is preferably fixed adjacent to the outer end of the same arm 27 in such manner that the upright portion of the "T" provides a spacer between lengths of chain 80 as the chain wraps around sprocket 84 and returns along the length of the arm.

In the above-described automatic embodiment 10, a sprocket shaft, indicated in phantom in FIG. 4, of sprocket 84 extends rotatably through the end of the mounting arm 27 and coaxially interconnects (or is one integral piece) with pivot pin 72, so that activation of cylinder 62 causes longitudinal movement of piston shaft 78, which, via chain 80, causes rotation of sprocket 84 and the shaft fixed thereto, resulting in rotation of angle iron piece 74 which is fixed thereto. Frame 24, when supported on device 10, will necessarily turn as sprocket 84 turns, and the bottom of the screen frame retained in the angle iron piece on arm 29 will pivot freely and correspondingly to the movement caused at the opposed end of the mounted screen frame.

In the second embodiment 110 pivot pins 72 on both arms 127, 129 are free to pivot in relation to the corresponding arm unless a known tightening mechanism, such as indicated generally by knob 73 in FIG. 3 is selectively applied.

Optional features which can be provided on either of the described embodiments include: as examples only, a backlight, such as that indicated at 88 in FIG. 1, which would most likely by connected by a power cord 90 to a source of electric power in the usual fashion; and a detent mechanism, such as a bump and groove arrangement, or a pin and hole device, for which disk 48, provides an example only (pin not shown). Other known stop means, and other options and accessories will be apparent to the skilled artisan.

Although the above-described embodiments illustrate the preferred structure for the new adjustable support for print screens, one skilled in the art will readily conceive equivalent structures which function appropriately. For example, angle iron pieces 74 could be substituted with pieces of half-round or with sections of U-shaped metal or even strong plastic. Similarly, for example, alternative known means of slideably adjustably connecting the collars to their respective carrying bars can be conceived, such as a peg and hole arrangement (not shown).

The above constructions for new adjustable support for screen frames provide a wide variety of useful options for the artisan. With the new adjustable support for print screens it is no longer necessary to be limited to treating a screen while it is in one static position, or to be otherwise forced to touch the wet screen in order to alter its position for treatment from another angle or from the other side of the screen.

There is now available an easily adjusted support device for print screens which permits the user to alter the position of the screen up and down, for screens and/or users of various sizes, and to alter the screen position around its longitudinal axis, as well as around a radial axis of the support device. The combination of these multiple structural adjustment features provides the new device with effectively unlimited positional possibilities for support of the work piece, as described further below.

When screen frame 24 is positioned with the long axis vertically, as in FIGS. 1 and 3 and rotated about the central longitudinal axis of the frame, the corners of the frame describe an invisible circle or portion thereof in a horizontal plane, as indicated by arrows A. Thus, this change in position, as shown by the positions of frame 24 in solid and phantom lines in FIG. 3 is referred to herein as horizontal rotation. When frame 24 is rotated "vertically" around a substantially horizontal axis extending radially from the pole 16, the corners of the frame describe an imaginary circle or portion thereof in a vertical plane.

When frame 24 is moved from the upright, vertical position in which it is disposed in FIG. 1, to the generally horizontal position shown in solid lines in FIG. 2, the path of travel is as indicated by arrows B. However, it is to be understood that frame 24 can be pivoted so that the longitudinal axis is at any angle between horizontal and vertical. This rotation is accomplished manually, by simply tilting the frame support rack in either of the clockwise or counterclockwise directions.

When positioned at any such preselected angle frame 24 is still rotatable around its central longitudinal axis. For example, the phantom lines in FIG. 2 illustrate such an intermediate frame position, with the long axis of frame 24 at one of many possible angles, in between horizontal and vertical. Arrows A, shown in phantom in FIG. 2, generally indicate the directions of optional rotation of the screen frame when it is so positioned, off vertical and off horizontal. This optional rotational positioning of frame 24 is possible with either embodiment shown and described, and in either embodiment the preselected position can be maintained simply by pressure and proper tensioning of the elements of support device 10, 110, or by addition of a holding or detenting device.

In view of the foregoing, it will be seen that the several objects of the invention are achieved and other advantages are attained.

Although the foregoing includes a description of the best mode contemplated for carrying out the invention, various modifications are contemplated.

As various modifications could be made in the constructions herein described and illustrated without departing from the scope of the invention, it is intended that all matter contained in the foregoing description or shown in the accompanying drawings shall be interpreted as illustrative rather than limiting.

What is claimed is:

1. A device for adjustably supporting a planar work piece having a stiff perimeter, during application of emulsion and other similar processes, the device comprising:

an upright stand assembly, the stand assembly being connectable to either of a support surface and a support base and being vertically adjustable to permit vertical adjustment of the position of a work piece on the device, and a screen frame support rack rotatably connected to the stand assembly in such manner as to permit selective vertical rotation of the entire screen support rack by up to at least 180° around a first axis, which first axis is substantially horizontal and extends radially, outwardly from a longitudinal axis of the upright stand, the screen frame support rack supporting the work piece in such a manner as to permit selective rotation of a work piece supported in the screen frame support rack around a second axis of rotation to any angle up to at least 180°, the second axis of rotation being a central axis of the work piece supported in the screen frame support rack;

whereby the position of the work piece supported on the device can be selectively adjusted both vertically and rotationally, the rotational adjustments being available around two different axes.

2. The support device of claim 1, and further comprising a substantially horizontal support base, wherein the stand assembly is connected to the base and extends substantially vertically upwardly therefrom.

3. The support device of claim 1, and further comprising a detent mechanism for providing releasable locking of the screen frame support rack in a preselected position around the first axis, without affecting selective rotation of the screen frame support rack around the second axis.

4. The support device of claim 1, wherein the stand assembly comprises at least one rigid pole disposed vertically upright relative to a horizontal support surface supporting the device, and the screen frame support rack has a sleeve, which sleeve is sized and shaped to correspond to a transverse outer perimeter of the at least one rigid pole, the sleeve being slideably disposed around the at least one rigid pole and made releasably connectable thereto by a connecting device, to thereby cause the screen frame support rack to be selectively vertically adjustable.

5. The support device of claim 1, and further comprising a shaft rotatably connected to at least one of the frame support rack and the upright stand, the shaft being fixed to the other one of the frame support rack and the upright stand, whereby the second axis of rotation can be selectively set at any preselected angular position from and including substantially horizontal to and including substantially vertical.

6. The device of claim 1, and further comprising a pivot mechanism on the screen frame support rack to thereby provide selective rotatability of the work piece around the second axis by any amount of rotation up to at least 360°.

7. The support device of claim 1, and further comprising automatic control means in operative connection with the screen frame support rack, to thereby permit selective rotation of the work piece around at least one of the first axis and second axis.

8. The support device of claim 7, wherein the automatic control means for effecting the automatic selective rotation of the work piece includes a control switch connected to a source of power.

9. The support device of claim 8, wherein the control switch is a foot switch.

10. The support device of claim 8, wherein the source of power is pneumatic.

11. The support device of claim 1, wherein the screen frame support rack is selectively vertically rotatable around the first axis in either of the clockwise and counterclockwise directions by up to at least 360°.

12. The support device of claim 1, wherein the stand assembly comprises a first pole and a second pole, the first pole being slidably vertically adjustable relative to the second pole, and a retaining device for retaining the first pole in a preselected coaxial longitudinal position relative to the second pole, to thereby provide selective adjustment of the height of the work piece supported in the screen frame support rack.

13. The support device of claim 12, wherein the retaining device is a thumbscrew which penetrates the second pole and contacts the first pole to thereby selectively retain the first pole in a longitudinal position relative to the second pole.

14. The support device of claim 12, wherein the screen frame support rack comprises a rigid bar having a first end and a second end, and a pivot pin, which pivot pin transversely penetrates the rigid bar and is rotatably mounted to the upright stand to thereby rotatably connect the screen frame support rack to the stand assembly.

15. The support device of claim 1, wherein the screen frame support rack comprises a rigid bar rotatably connected to the upright stand spacedly from the upright stand in a manner to permit the screen frame support device to rotate around the first axis, and a first rigid arm and a second rigid arm extending spacedly and parallel to one another, transversely and outwardly from the rigid bar, the first arm and the second arm each having a first end and a second end and extending continuously between the respective first ends and second ends thereof, the first end of the first arm and the first end of the second arm being connected to the rigid bar, and at least one of the first arm and the second arm being adjustably connected to the rigid bar so as to be adjustable along the axis of the rigid bar, to thereby permit use of the screen frame support rack for support of work pieces of a variety of sizes.

16. The support device of claim 15, and further comprising a first angle piece and a second angled piece, the first angled piece being transversely and mounted at the second end of the first arm and the second angled piece being transversely and mounted at the second end of the second arm, the first angle piece and the second angled piece being disposed with the angled open sides thereof facing one another, to thereby retain the work piece in the screen frame support rack, the first angled piece and the second angled piece each being connected to the corresponding first arm and second arm by a pin, at least one of the first angle piece and the second angled piece being pivotal in relation to the corresponding first arm and second arm, to thereby provide rotatable support of a work piece supported in the screen frame support rack by up to at least 180° in either of the clockwise and counterclockwise directions around the second axis of rotation.

17. The support device of claim 15, wherein the at least one of the first arm and the second arm is adjustably connected to the rigid bar by a sleeve fixed to the first end of the at least one of the first arm and the second arm, the sleeve defining an opening therethrough, which opening is sized and shaped appropriately for slidable receipt of the rigid bar, and a releasable connecting device by which the sleeve is selectively releasably connected to the rigid bar at a position along the length of the rigid bar which substantially corresponds to the length of one dimension of a work piece which is mounted in the screen frame support rack on the support device.

18. The device or claim 17, and further comprising a fluid cylinder and chain assembly mounted to at least one of the first arm and the second arm, the fluid cylinder and chain assembly being operatively connected to the pin connected to the at least one of the first arm and the second arm, and a source of power connected to the fluid cylinder and chain assembly, so as to permit a user of the device to selectively cause rotational movement of the angled piece connected to the at least one of the first arm and the second arm to which the fluid cylinder and chain assembly is operatively connected, to thereby cause rotational movement of the work piece mounted between the first angled piece and the second angled piece in the screen frame support rack in either of the clockwise and counterclockwise directions selected.

19. The device of claim 2, and further comprising movable structure connected to the base, to thereby permit a user of the support device to readily move the support device from one location to another.

20. The device of claim 1, and further comprising a light connected to the device in a position to selectively provide back-lighting for the workpiece.

* * * * *